United States Patent
Ooyagi et al.

(10) Patent No.: US 8,030,977 B2
(45) Date of Patent: Oct. 4, 2011

(54) CLOCK GENERATING CIRCUIT

(75) Inventors: Mitsuru Ooyagi, Fukaya (JP); Tomoaki Nishi, Nagaoka (JP)

(73) Assignees: Sanyo Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/691,530

(22) Filed: Jan. 21, 2010

(65) Prior Publication Data

US 2010/0182066 A1    Jul. 22, 2010

(30) Foreign Application Priority Data

Jan. 22, 2009    (JP) .................... 2009-012282

(51) Int. Cl.
    *H03L 7/00*    (2006.01)
(52) U.S. Cl. .............. 327/141; 327/291; 327/299
(58) Field of Classification Search .............. None
    See application file for complete search history.

(56) References Cited

U.S. PATENT DOCUMENTS

| | | | | |
|---|---|---|---|---|
| 3,745,367 A | * | 7/1973 | Schindler et al. | 307/108 |
| 5,668,508 A | * | 9/1997 | Pulvirenti et al. | 331/111 |
| 6,052,035 A | * | 4/2000 | Nolan et al. | 331/74 |
| 6,456,170 B1 | * | 9/2002 | Segawa et al. | 331/143 |
| 6,587,006 B2 | * | 7/2003 | Kawajiri et al. | 331/45 |
| 6,850,101 B1 | * | 2/2005 | De Stasi | 327/141 |
| 7,724,100 B2 | * | 5/2010 | Gong et al. | 331/111 |

FOREIGN PATENT DOCUMENTS

JP    08-307254    11/1996

* cited by examiner

*Primary Examiner* — Tuan T Lam
(74) *Attorney, Agent, or Firm* — SoCal IP Law Group LLP; Steven C. Sereboff; John E. Gunther

(57) ABSTRACT

A main (sub) clock circuit comprising a first (second) capacitor, a first (second) current-supply circuit to supply to the first (second) capacitor a first (third) current for charging at a predetermined-current value or a second (fourth) current for discharging at a predetermined-current value, a first (second) charge/discharge-control circuit to output a first (second) control signal for switching between the first (third) current and second (fourth) current which are supplied to the first (second) capacitor from the first (second) current-supply circuit when a voltage across the first (second) capacitor has reached a first (third) reference voltage or second (fourth) reference voltage higher than the first (third) reference voltage, and a first (second) output circuit to output a main (sub) clock according to the first (second) control signal, the first capacitor having one end connected to a first potential, the second capacitor having one end to which the main clock is input.

10 Claims, 8 Drawing Sheets

CLOCK GENERATING CIRCUIT

CROSS-REFERENCE TO RELATED APPLICATION

This application claims the benefit of priority to Japanese Patent Application No. 2009-12282, filed Jan. 22, 2009, of which full contents are incorporated herein by reference.

BACKGROUND OF THE INVENTION

1. Field of the Invention

The present invention relates to a clock generating circuit.

2. Description of the Related Art

A PLL (Phase Locked Loop) circuit and a DLL (Delay Locked Loop) circuit are generally known as a clock generating circuit that generates a clock synchronized with an input clock. For example, FIG. 13 of Japanese Patent Application Laid-Open Publication No. Hei8-307254 discloses the PLL circuit including a phase comparator, a charge pump, a loop filter, and a voltage-controlled oscillator. For example, FIG. 15 of Japanese Patent Application Laid-Open Publication No. Hei8-307254 discloses the DLL circuit that including a voltage-controlled delay circuit in place of the voltage-controlled oscillator. Such a PLL circuit or DLL circuit compares two clock signals at the phase comparator, converts a result of such comparison into a controlled potential by the charge pump and the loop filter, and controls the voltage-controlled oscillator/voltage-controlled delay circuit so that a frequency difference and a phase difference between the clock signals are reduced based on the controlled potential.

As such, it is possible to generate a clock synchronized with the input clock by using the PLL circuit or the DLL circuit.

In the above PLL circuit or DLL circuit, however, since the clock (hereinafter referred to as sub-clock) generated based on the input signal served as a reference (hereinafter referred to as main clock) is controlled according to the result of comparison with the main clock, when the main clock is stopped, the sub-clock may get out of normal control, causing a problem in operation of a circuit supplied with the sub-clock.

For this reason, attention must be paid to design of a system as a whole needs to be considered so that the sub-clock is generated after the main clock is started and the main clock is stopped after the sub-clock is stopped.

SUMMARY OF THE INVENTION

A clock generating circuit according to an aspect of the present invention, comprises: a main clock circuit configured to output a main clock; and a first sub-clock circuit configured to output a first sub-clock synchronized with the main clock, based on the main clock, the main clock circuit including a first capacitor having one end connected to a first potential, a first current supply circuit configured to supply to the first capacitor a first current for charging at a predetermined current value or a second current for discharging at a predetermined current value, a first charge/discharge control circuit configured to output a first control signal for switching between the first current and the second current when a voltage across the first capacitor has reached a first reference voltage or a second reference voltage higher than the first reference voltage, the first current and the second current supplied to the first capacitor from the first current supply circuit, and a first output circuit configured to output the main clock according to the first control signal, the first sub-clock circuit including a second capacitor having one end to which the main clock is input, a second current supply circuit configured to supply to the second capacitor a third current for charging at a predetermined current value or a fourth current for discharging at a predetermined current value, a second charge/discharge control circuit configured to output a second control signal for switching between the third current and the fourth current when a voltage across the second capacitor has reached a third reference voltage or a fourth reference voltage higher than the third reference voltage, the third current and the fourth current supplied to the second capacitor from the second current supply circuit, and a second output circuit configured to output the first sub-clock according to the second control signal.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which:

FIG. 3 is an explanatory diagram of another operation of a main clock circuit 5a;

DETAILED DESCRIPTION OF THE INVENTION

At least the following details will become apparent from descriptions of this specification and of the accompanying drawings.

First Embodiment

A configuration will hereinafter be described of a clock generating circuit according to a first embodiment of the present invention with reference to FIG. 1. It is assumed in an embodiment and subsequent embodiments of the present invention that a switch circuit is on when a control signal is high and is off when the control signal is low.

Figure 1:
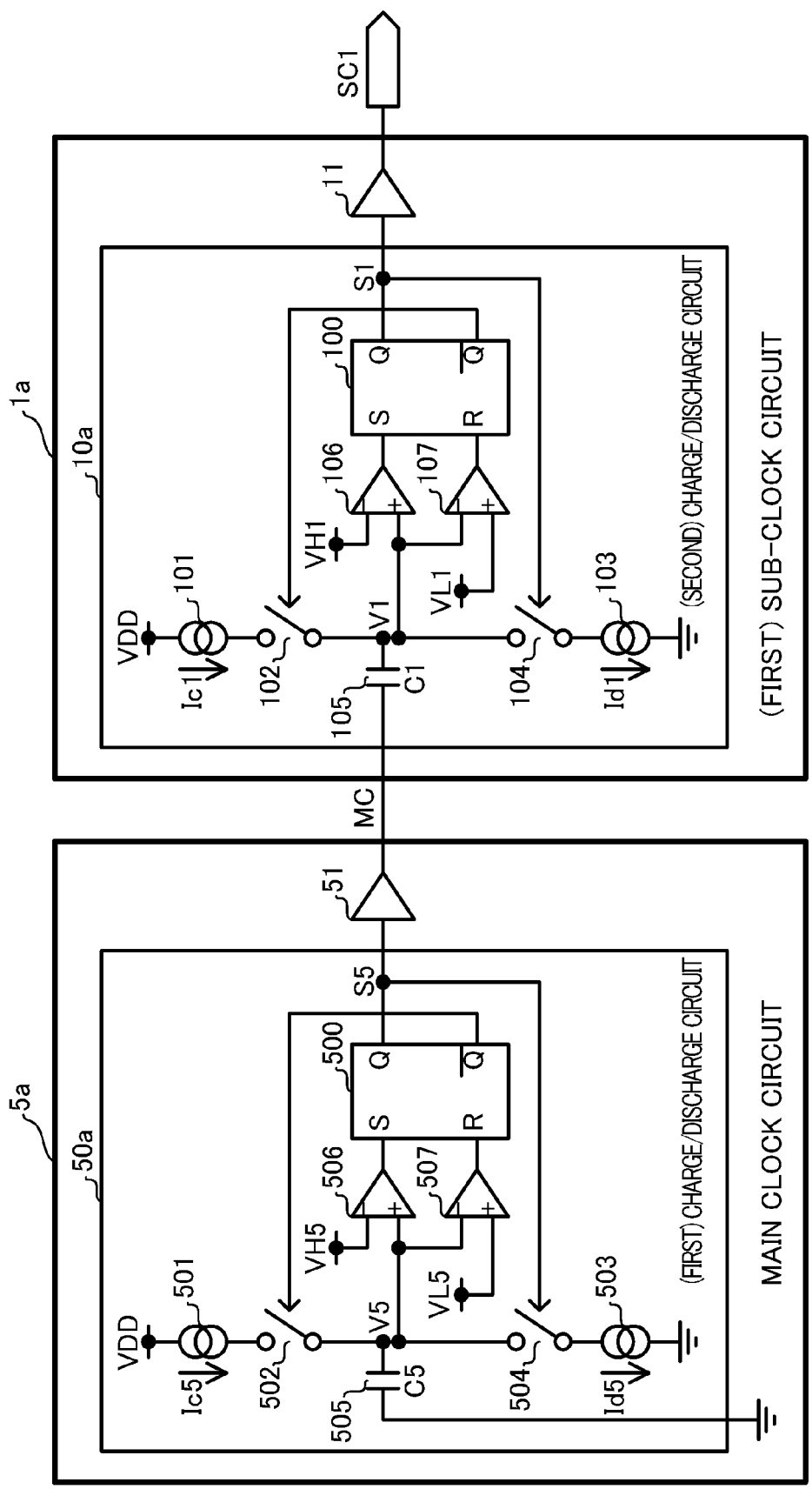
FIG. 1 is a circuit block diagram of a configuration of a clock generating circuit according to a first embodiment of the present invention.

The clock generating circuit shown in FIG. 1 includes a main clock circuit 5a and a (first) sub-clock circuit 1a.

The main clock circuit 5a includes: a (first) charge/discharge circuit 50a corresponding to a first current supply circuit and a first charge/discharge control circuit; and a buffer circuit 51 corresponding to a first output circuit, for example, in an embodiment of the present invention.

The charge/discharge circuit 50a includes an RSFF (RS flip-flop) 500, current sources 501 and 503, switch circuits 502 and 504, a capacitor 505, and comparators 506 and 507, for example, in an embodiment of the present invention. In the RSFF 500, output signals of the comparators 506 and 507 are input to its S input (set input) and R input (reset input), respectively, and its inverted output signal serves as a control signal of the (first) switch circuit 502 and its non-inverted output signal serves as a control signal of the (second) switch circuit 504 and at the same time is output from the charge/discharge circuit 50a as a (first) control signal S5. The current source 501 connected to a power source potential VDD, the switch circuit 502, the switch circuit 504, and the current source 503 connected to a ground potential GND are connected in series in the above order. One end of the (first) capacitor 505 is connected to the ground potential GND (first potential) and the other end thereof is connected to a connection point of the switch circuits 502 and 504, which connection point is connected to a non-inverted input of the comparator 506 and an inverted input of the comparator 507. The inverted input of the comparator 506 is applied with a (second) reference voltage VH5, the non-inverted input of the comparator 507 is applied with a (first) reference voltage VL5 lower than the reference voltage VH5, and the output signals of these comparators are input to the RSFF 500 as described above.

The control signal S5 from the charge/discharge circuit 50a is input to the buffer circuit 51 and the output signal of the buffer circuit 51 is output from the main clock circuit 5a as a main clock MC.

The sub-clock circuit 1a, for example, a (second) charge/discharge circuit 10a corresponding to a second current supply circuit as well as a second charge/discharge control circuit and a buffer circuit 11 corresponding to a second output circuit in an embodiment of the present invention.

The charge/discharge circuit 10a includes, for example, an RSFF 100, current sources 101 and 103, switch circuits 102 and 104, a capacitor 105, and comparators 106 and 107 in an embodiment of the present invention. In the RSFF 100, output signals of the comparators 106 and 107 are input to its S input and R input, respectively, and its inverted output signal serves as a control signal of the (third) switch circuit 102 and its non-inverted output signal serves as a control signal of the (fourth) switch circuit 104 and at the same time is output from the charge/discharge circuit 10a as a (second) control signal S1. The current source 101 connected to the power source potential VDD, the switch circuit 102, the switch circuit 104, and the current source 103 connected to the ground potential GND are connected in series in the above order. The main clock MC is input to one end of the (second) capacitor 105, and the other end thereof is connected to a connection point of the switch circuits 102 and 104, which connection point is connected to a non-inverted input of the comparator 106 and an inverted input of the comparator 107. The inverted input of the comparator 106 is applied with a (fourth) reference voltage VH1, the non-inverted input of the comparator 107 is applied with a (third) reference voltage VL1 lower than the reference voltage VH1, and the output signals of these comparators are input to the RSFF 100 as described above.

The control signal S1 from the charge/discharge circuit 10a is input to the buffer circuit 11 and the output signal of the buffer circuit 11 is output from the sub-clock circuit 1a as a (first) sub-clock SC1.

As is apparent from the above, constituent components in the main clock circuit 5a are connected in the same manner as those in the sub-clock circuit 1a are, except that one end of the capacitor 505 is connected to the ground potential GND in the main clock circuit 5a, while one end of the capacitor 105 is connected to the output of the main clock circuit 5a in the sub-clock circuit 1a.

Figure 2:
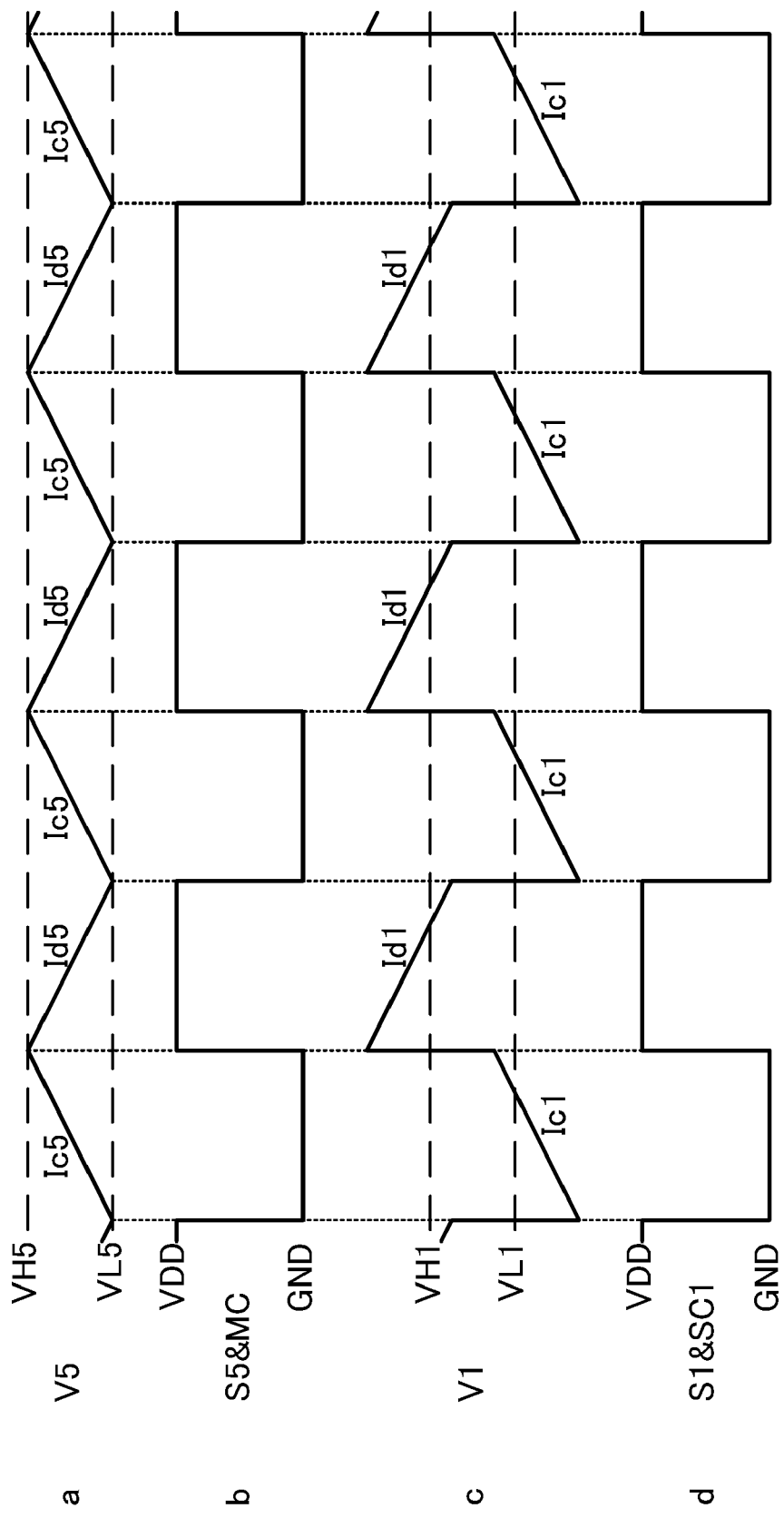
FIG. 2 is an explanatory diagram of an operation of a clock generating circuit according to a first embodiment of the present invention.

Operation will then be described of the clock generating circuit in an embodiment of the present invention with reference to FIGS. 1 and 2.

The normal operation will now be described in a case where the main clock circuit 5a outputs the main clock MC and the sub-clock circuit 1a outputs the sub-clock SC1.

In the charge/discharge circuit 50a of the main clock circuit 5a, when the non-inverted output signal of the RSFF 500, namely, the control signal S5, is low, the switch circuit 502 is on and the switch circuit 504 is off, and thus the capacitor 505 to be charged by a (first) current Icy flowing from the current source 501. Since one end of the capacitor 505 is connected to the ground potential GND as described above, a voltage V5 at the connection point of the switch circuits 502 and 504 becomes equal to a voltage across the capacitor 505. Here, taking capacitance of the capacitor 505 as C5 and differentiating the voltage V5 with respect to time t give $$dV5/dt = Ic5/C5$$

and therefore, when the current Ic5 is constant, the voltage V5 increases at a constant gradient.

When the voltage V5 increases and has reached the reference voltage VH5, the output signal of the comparator 506 goes high and the control signal S5 goes high, so that the switch circuit 502 is tuned off and the switch circuit 504 is turned on, and thus the capacitor 505 is discharged by a (second) current Id5 flowing into the current source 503. Here, differentiating the voltage V5 with respect to time t gives $$dV5/dt = -Id5/C5$$

and therefore, when the current Id5 is constant, the voltage V5 decreases at the constant gradient.

When the voltage V5 further decreases and has reached the reference voltage VL5, the output signal of the comparator 507 goes high and the control signal S5 goes low, so that the charging of the capacitor 505 is restarted.

As such, when the voltage V5 decreases and has reached the reference voltage VL5, the charge/discharge circuit 50a turns on the switch circuit 502, turns off the switch circuit 504, and supplies the current Ic5 from the current source 501, so that the capacitor 505 is charged at a constant current value, and when the voltage V5 increases and has reached the reference voltage VH5, the charge/discharge circuit 50a turns off the switch circuit 502, turns on the switch circuit 504, and supplies the current Id5 from the current source 503, so that the capacitor 505 is discharged at the constant current value.

By repeating the above operation, the voltage V5 forms a triangle wave in which switching between increasing and decreasing takes place each time the voltage V5 reaches the reference voltage VL5 or VH5, as shown in a of FIG. 2, for example. The control signal S5 becomes a binary signal whose level is switched each time the voltage V5 reaches the reference voltage VL5 or VH5, as shown in b of FIG. 2, for example, and then buffering is performed by the buffer circuit 51, to be output as the main clock MC.

Figure 3:
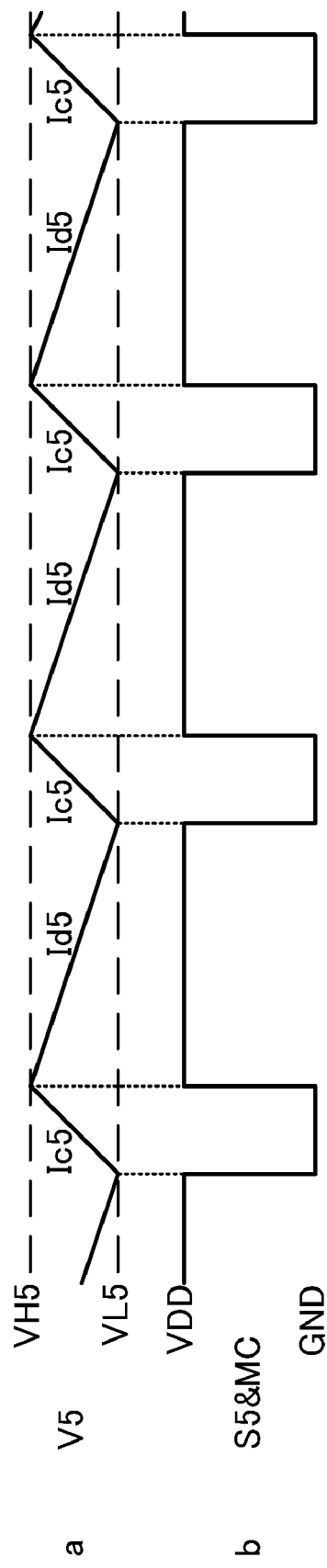

Frequency of the main clock MC is determined by the gradient of the voltage V5 and the reference voltages VL5 and VH5 and a duty ratio (duty cycle) of the main clock MC is determined by a ratio between the current Ic5 and the current Id5. For example, FIG. 2 shows a case where the current Icy is equal to the current Id5 so that the duty ratio of the main clock MC is 50% while FIG. 3 shows a case where the current Ic5 is greater than the current Id5 so that the duty ratio of the main clock MC is greater than 50%.

Even if one end of the capacitor 505 is connected to a fixed potential other than the ground potential GND, the main clock circuit 5a outputs the main clock MC in the same manner as described above. For example, even in a case where one end of the capacitor 505 is connected to the power source potential VDD, the voltage V5 increases so as to approach the power source potential VDD when the control signal S5 goes low, and decreases so as to approach the ground potential GND when the control signal S5 goes high, and thus, the voltage V5, the control signal S5, and the main clock MC as shown in FIGS. 2 and 3 are generated.

In the charge/discharge circuit 10a of the sub-clock circuit 1a, when the non-inverted output signal of the RSFF 100, namely, the control signal S1, is low, the switch circuit 102 is on and the switch circuit 104 is off, and thus the capacitor 105 is charged by a (third) current Ic1 flowing from the current source 101. Since the main clock MC is input to one end of the capacitor 105, as described above, a voltage V1 at the connection point of the switch circuits 102 and 104 becomes equal to a sum of the level of the main clock MC and a voltage across the capacitor 105. Here, taking capacitance of the capacitor 105 as C1 and differentiating the voltage V1 with respect to time t give $$dV1/dt=Ic1/C1$$

and therefore, when the current Ic1 is constant, the voltage V1 increases at a constant gradient.

When the main clock MC switches from a low level (ground potential GND) to a high level (power source potential VDD), the voltage V1 increases by an amount of the level changed (source voltage VDD) to reach the reference voltage VH1, the output signal of the comparator 106 goes high, and the control signal S1 goes high, so that, the switch circuit 102 is turned off and the switch circuit 104 is turned on, and thus, the capacitor 105 is discharged by a (fourth) current Id1 flowing into the current source 103. Here, differentiating the voltage V1 with respect to time t gives:

$$dV1/dt=-Id1/C1$$

and therefore, when the current Id1 is constant, the voltage V1 decreases at the constant gradient.

Further, when the main clock MC switches from the high level to the low level, the voltage V1 decreases by the amount of the level changed to reach the reference voltage VL1, the output signal of the comparator 107 goes high, and the control signal S1 goes low, so that the charging of the capacitor 105 is restarted.

As such, when the main clock MC goes high and the voltage V1 has reached the reference voltage VL1, the charge/discharge circuit 10a turns on the switch circuit 102, turns off the switch circuit 104, and supplies the current Ic1 from the current source 101, so that the capacitor 105 is charged at a constant current value, and when the main clock MC goes low and the voltage V1 has reached the reference voltage VH1, the charge/discharge circuit 10a turns off the switch circuit 102, turns on the switch circuit 104, and supplies the current Id1 from the current source 103, so that the capacitor 105 is discharged at the constant current value.

By repeating the above operation, the voltage V1 increases for a time and then decreases at the constant gradient when the main clock MC goes high, and the voltage V1 decreases for a time and then increases at the constant gradient when the main clock goes low, as shown in c of FIG. 2, for example. The control signal S1 becomes a binary signal whose level is switched each time and in the same manner as the level of the main clock MC is switched, as shown in d of FIG. 2, for example, and then buffering is performed by the buffer circuit 11, to be output as the sub-clock SC1 synchronized with the main clock MC.

It is assumed that the voltage V1 does not reach the reference voltage VH1 while the capacitor 105 is being charged by the current Ic1 and that the voltage V1 does not reach the reference voltage VL1 while the capacitor 105 is being discharged by the current Id1. Such conditions are not special operating conditions but a condition is enough if such a relationship as to be commonly set is established, such as GND<VL5(=VL1)<VH5(=VH1)<VDD when the main clock circuit 5a and the sub-clock circuit 1a have the same circuit constant, namely, in a case of C5=C1, Ic5=Ic1, Id5=Id1, VL5=VL1, and VH5=VH1, which is a typical example.

The main clock circuit 5a and the sub-clock circuit 1a are connected in the same manner except for the connections of the one end of the capacitors 505 and 105 as described above, and therefore, it may be possible that functions of the main clock circuit 5a and the sub-clock circuit 1a may be interchanged by connecting the one end of the capacitor 105 to the ground potential GND and connecting the one end of the capacitor 505 to the output of the buffer circuit 11, if the circuit constants are set to be equal.

The operation will then be described in a case where the main clock circuit 5a does not output the main clock MC.

When the main clock circuit 5a stops its operation by its own function or under control of another circuit or device, the main clock MC stops being output and the output of the main clock circuit 5a is fixed at the low level (ground potential GND), for example. This is equivalent to that the one end of the capacitor 105 of the sub-clock circuit 1a is fixed to the ground potential GND, and the sub-clock circuit 1a can output the (sub) clock SC1 by the same operation as that of the main clock circuit 5a as described above, despite absence of the main clock MC with which the clock SC1 is to be synchronized. As described above, when the circuit constants of the main clock circuit 5a and the sub-clock circuit 1a are set to be equal, the frequency and the duty ratio of the (sub) clock SC1 may be allowed to be equal to those of the main clock MC before the absence.

In the same manner as in the case of the main clock circuit 5a described above, even if the one end of the capacitor 105 is fixed to other than the ground potential GND after the stop of the operation of the main clock circuit 5a, the sub-clock circuit 1a outputs the (sub) clock SC1 in the same manner as described above.

The main clock circuit 5a is not affected by the operation of the sub-clock circuit 1a and still continues to output the main clock MC even when the sub-clock circuit 1a does not output the sub-clock SC1.

As such, since the sub-clock circuit 1a autonomously generates and outputs the (sub) clock SC1 even after the main clock circuit 5a stops its operation, the main clock circuit 5a and the sub-clock circuit 1a may be started or stopped in arbitrary order.

Second Embodiment

Configuration will now be described of the clock generating circuit in a second embodiment of the present invention with reference to FIG. 4. In an embodiment of the present invention and subsequent embodiments, it is assumed that a clock stop signal stops operation of the clock circuit when it is at the low level.

Figure 4:
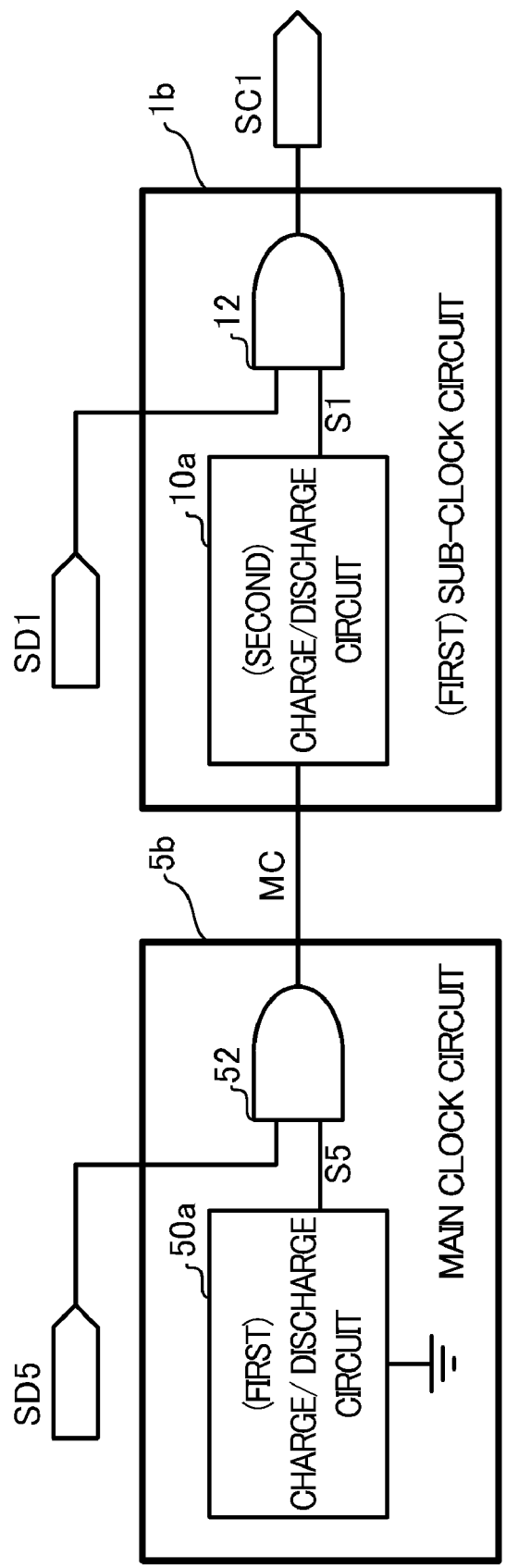
FIG. 4 is a block diagram of a configuration of a clock generating circuit according to a second embodiment of the present invention.

The clock generating circuit shown in FIG. 4 includes a main clock circuit 5b and a (first) sub-clock circuit 1b.

The main clock circuit 5b includes, for example, the charge/discharge circuit 50a and an AND circuit (logical AND circuit) 52 corresponding to a first output circuit in an embodiment of the present invention. A main clock stop signal SD5 for stopping the operation of the main clock circuit 5b is input to one input of the AND circuit 52, the control signal S5 is input to the other input of the AND circuit 52 from the charge/discharge circuit 50a, and the output signal of the AND circuit 52 is output from the main clock circuit 5b as the main clock MC.

The sub-clock circuit 1b includes, for example, the charge/discharge circuit 10a and an AND circuit 12 corresponding to a second output circuit in an embodiment of the present invention. A (first) sub-clock stop signal SD1 for stopping the operation of the sub-clock circuit 1b is input to one input of the AND circuit 12, the control signal S1 is input to the other input of the AND circuit 12 from the charge/discharge circuit 10a, and the output signal of the AND circuit 12 is output from the sub-clock circuit 1b as the sub-clock SC1.

As described above, in a first embodiment, to whichever potential the output may be fixed after the main clock circuit 5a stops its operation, the sub-clock circuit 1a continues to output the (sub) clock SC1 in the same manner. However, if it is desired that the potential to which the output is to be fixed is predefined, the control signal S5 is required to be converted and then be taken as the main clock MC. In an embodiment of the present invention, by using the AND circuit 52 with one input thereof to which the main clock stop signal SD5 is input, the output of the main clock circuit 5b may be fixed at the low level when the main clock stop signal SD5 goes low.

In an embodiment of the present invention, in the same manner as in the case of a first embodiment, since the sub-clock circuit 1b is of substantially the same configuration as that of the main clock circuit 5b, the configuration may be made such that the functions of the main clock circuit and the sub-clock circuit may be interchanged by interchanging the connections of the capacitors.

As such, the AND circuits 52 and 12 are used as the first and the second output circuits, respectively, and thus, when the main clock circuit 5b and/or the sub-clock circuit 1b stops operation, the outputs or output thereof is fixed at the low level. In the same manner as in the case of a first embodiment, since the sub-clock circuit 1b autonomously generates and outputs the (sub) clock SC1 even after the main clock circuit 5b stops its operation, the main clock circuit 5b and the sub-clock circuit 1b may be started or stopped in arbitrary order.

Third Embodiment

Configuration will now be described of the clock generating circuit in a third embodiment of the present invention with reference to FIG. 5.

Figure 5:
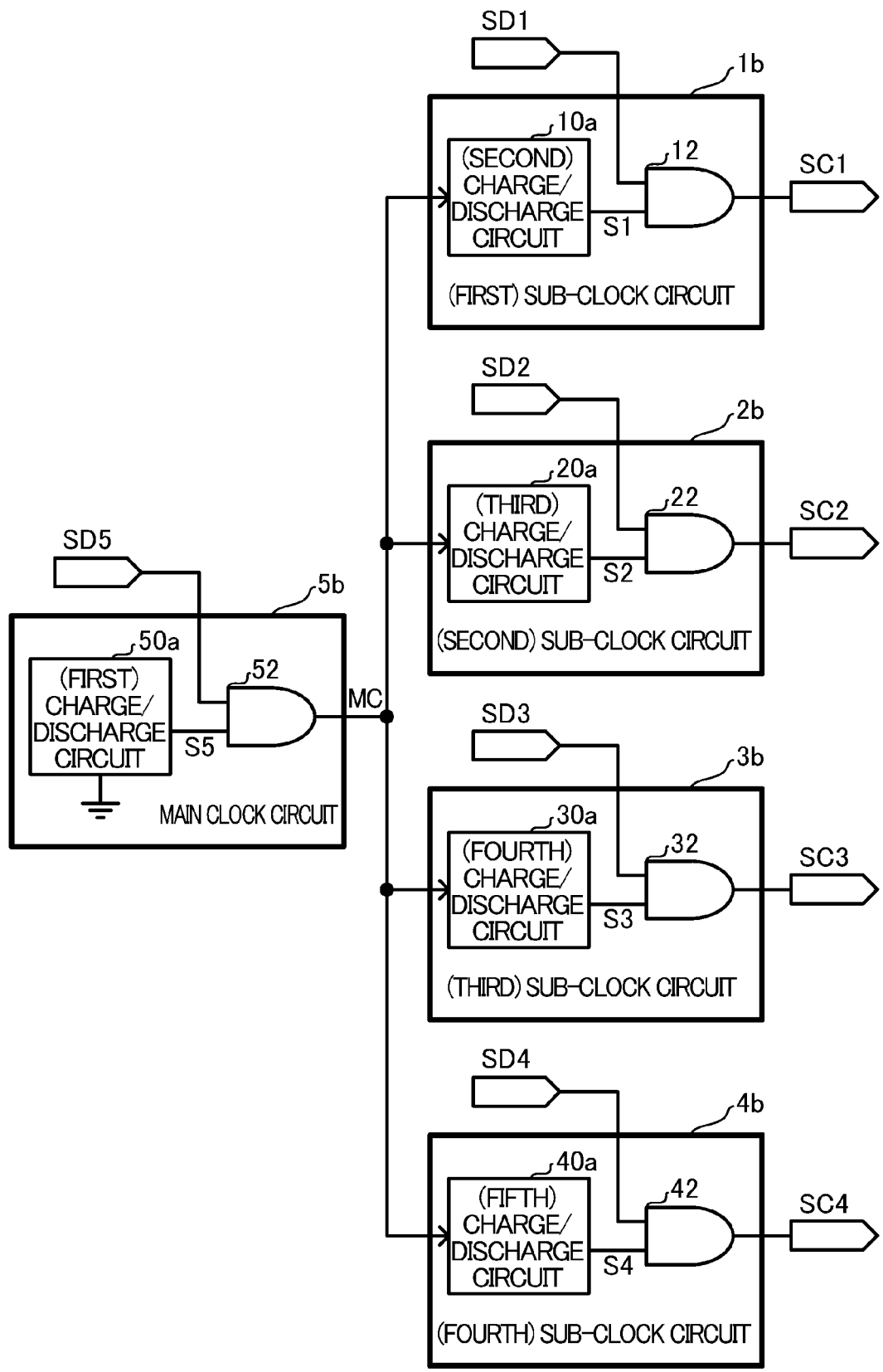
FIG. 5 is a block diagram of a configuration of a clock generating circuit according to a third embodiment of the present invention.

The clock generating circuit shown in FIG. 5 includes the main clock circuit 5b and (first to fourth) sub-clock circuits 1b to 4b.

The sub-clock circuits 2b to 4b are of the same configuration as that of the sub-clock circuit 1b and the main clock MC is input, in parallel, to (third to fifth) charge/discharge circuits 20a to 40a, and (second to fourth) sub-clocks SC2 to SC4 are output from AND circuits 22 to 42 corresponding to third to fifth output circuits, respectively. Each of (second to fourth) sub-clock stop signals SD2 to SD4 for stopping operation of the sub-clock circuits 2b to 4b are input to each one of inputs of the AND circuits 22 to 42.

By adopting a parallel connection configuration as above, when all of the main clock stop signal SD5 and the sub-clock stop signals SD1 to SD4 are high, the sub-clock circuits 1b to 4b output the sub-clocks SC1 to SC4 synchronized with the main clock MC, respectively.

When the main clock circuit 5b stops its operation, namely, when the main clock stop signal SD5 goes low, the output of the main clock circuit 5b is fixed at the low level, and therefore, the sub-clock circuits 1b to 4b autonomously generates and outputs the (sub) clock SC1 to SC4, respectively.

Furthermore, when any of the sub-clock circuits 1b to 4b stops its operation, other sub-clock circuits and the main clock circuit 5b are not affected thereby. For example, when the sub-clock circuits 1b and 2b stop the operation, the main clock circuit 5b still continues to output the main clock MC and the sub-clock circuits 3b and 4b still continue to output the sub-clocks SC3 and SC4 synchronized with the main clock MC, respectively.

As such, by connecting in parallel the sub-clock circuits 1b to 4b, which have the similar configuration, to the main clock circuit 5b, the main clock circuit 5b and the sub-clock circuit 1b to 4b may be started or stopped in arbitrary order.

Fourth Embodiment

Configuration will now be described of the clock generating circuit in a fourth embodiment of the present invention with reference to FIG. 6.

Figure 6:
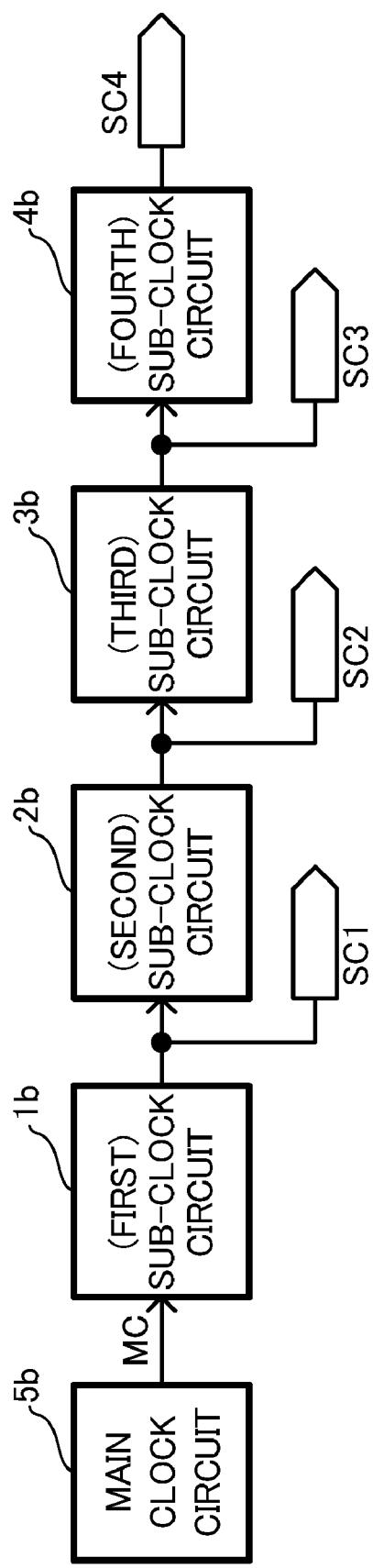
FIG. 6 is a block diagram of a configuration of a clock generating circuit according to a fourth embodiment of the present invention.

The clock generating circuit shown in FIG. 6 includes the main clock circuit 5b and the sub-clock circuits 1b to 4b, in the same manner as in the case of a third embodiment. The main clock circuit 5b and the sub-clock circuits 1b to 4b are connected in series in this order so that the output signal of each clock circuit is input to the clock circuit of the following-stage.

By adopting a series connection configuration as above, when all of the main clock stop signal SD5 and the sub-clock stop signals SD1 to SD4 are high, the sub-clock circuits 1b to 4b output the sub-clock SC1 synchronized with the main clock MC, the sub-clock SC2 synchronized with the sub-clock SC1, the sub-clock SC3 synchronized with the sub-clock SC2, and the sub-clock SC4 synchronized with the sub-clock SC3, respectively. In such case, the sub-clocks SC1 to SC4 are synchronized with the main clock MC.

When any of the main clock circuit 5b and the sub-clock circuits 1b to 4b stops operation, the clock circuit of the following-stage of the above clock circuit autonomously generates and outputs the (sub) clock and each of other clock circuits outputs the sub-clock synchronized with the input clock. For example, when the sub-clock circuit 2b stops its operation, the main clock circuit 5b still continues to output the main clock MC, the sub-clock circuit 1b still continues to output the sub-clock SC1 synchronized with the main clock MC, the sub-clock circuit 3b autonomously generates and outputs the (sub) clock SC3, and the sub-clock circuit 4b outputs the sub-clock SC4 synchronized with the (sub) clock SC3. In this case, the sub-clocks SC3 and SC4 are not synchronized with the main clock MC. When the sub-clock circuit 4b stops its operation, the main clock circuit 5b and the sub-clock circuits 1b to 3b are not affected thereby.

As such, by connecting in series the sub-clock circuits 1b to 4b, which have the similar configuration, to the main clock circuit 5b, the main clock circuit 5b and the sub-clock circuit 1b to 4b may be started or stopped in arbitrary order.

As described above, in the clock generating circuit shown in FIG. 1, the main clock circuit 5a and the sub-clock circuit 1a are respectively configured such that switching is performed between the operation of charging the capacitors (505, 105) at the constant current values by supplying the currents (Ic5, Ic1) and the operation of discharging the capacitors at the constant current values by supplying the currents (Id5, Id1) when the voltages (V5, V1) across the capacitors has reached the two reference voltages (VL5 and VH5, VL1 and VH1), and the main clock MC and the sub-clock SC1 are output according to the control signals (S5, S1) for performing such switching, and thus, the circuits may be started or stopped in arbitrary order.

The control signals S5 and S1 are the binary signals for performing control in a complementary manner so that the switch circuits (502, 102) for supplying the currents (Ic5, Ic1) to the capacitors are turned on when the voltages across the capacitors have reached the lower reference voltages (VL5, VL1) and the switch circuits (504, 104) for supplying the currents (Id5, Id1) to the capacitors are turned on when the voltages have reached the higher reference voltages (VH5, VH1), respectively, and thus, the main clock MC and the sub-clock SC1 may be output whose frequencies and duty ratios are determined by the two currents (Ic5 and Id5, Ic1 and Id1), the capacitance (C5, C1) of the capacitors, and the two reference voltages, respectively.

By frequency dividing the control signals S5 and S1 to be output as the main clock MC and the sub-clock SC1, respectively, the main clock MC having a frequency different from that of the control signal S5 and the sub-clock SC1 having a frequency different from that of the control signal S1 may be output.

As shown in FIG. 4, by outputting the control signals S5 and S1 via the AND circuits (52, 12) each having one input to which each of the clock stop signals (SD5, SD1) is input, when the main clock circuit 5b and/or the sub-clock circuit 1b stops its operation, the outputs or output thereof may be fixed at low level.

As shown in FIG. 5, by connecting the sub-clock circuits 1b to 4b in parallel to the main clock 5b, the main clock circuit 5b and the sub-clock circuits 1b to 4b may be started or stopped in arbitrary order.

As shown in FIG. 6, by connection the sub-clock circuits 1b to 4b in series to the main clock circuit 5b, the main clock circuit 5b and the sub-clock circuits 1b to 4b may be started or stopped in arbitrary order.

Figure 7:
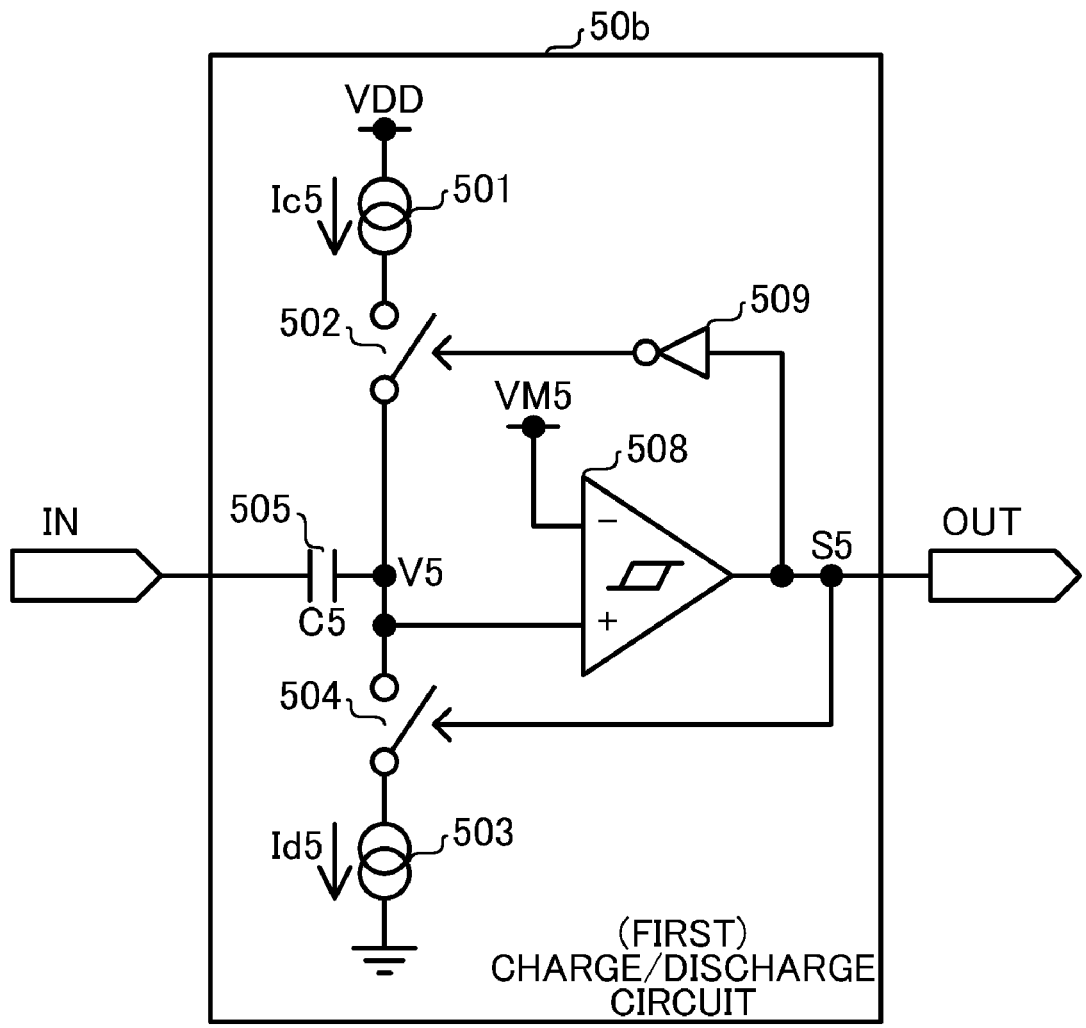
FIG. 7 is a circuit block diagram of another configuration example of a charge/discharge circuit used in a clock generating circuit according to the present invention.

In embodiments described above, charge/discharge circuits have such configurations as those of the charge/discharge circuits 50a and 10a illustrated in FIG. 1 by way of example, but this is not limitative. As illustrated in a charge/discharge circuit 50b of FIG. 7, for example, the configuration may be made including a comparator 508 and an inverter (inverting circuit) 509 in place of the RSFF 500 and the comparators 506 and 507 of the charge/discharge circuit 50a. The comparator 508 is a hysteresis comparator and if a reference voltage VM5 applied to its inverted input is set at a medium voltage of the reference voltages VL5 and VH5 and a hysteresis width is set at a difference voltage of the reference voltages VL5 and VH5, the charge/discharge circuit 50b is equivalent to, and operates in the same manner as, the charge/discharge circuit 50a.

In a first embodiment as described above, the buffer circuit 51, which buffers the control signal S5 and outputs the main clock MC in phase therewith, and the buffer circuit 11, which buffers the control signal S1 and outputs the sub-clock SC1 in phase therewith, are used as the first and the second output circuits, respectively, but this is not limitative. The output circuits may be circuits that directly output the control signals S5 and S1 as the main clock MC and the sub-clock SC1, respectively, or may be inverting buffer circuits that output the main clock MC having a phase opposite to that of the control signal S5 and the sub-clock SC1 having a phase opposite to that of the control signal S1, respectively.

In second to fourth embodiments as described above, each AND circuit may appropriately be changed to an OR circuit (logical OR circuit), a NAND circuit (negative logical AND circuit), a NOR circuit (negative logical OR circuit), etc., according to the polarity of the input clock stop signal, the polarity of the clock to be output corresponding to the input control signal, and the level at which the output is to be fixed when each clock circuit stops its operation.

Figure 8:
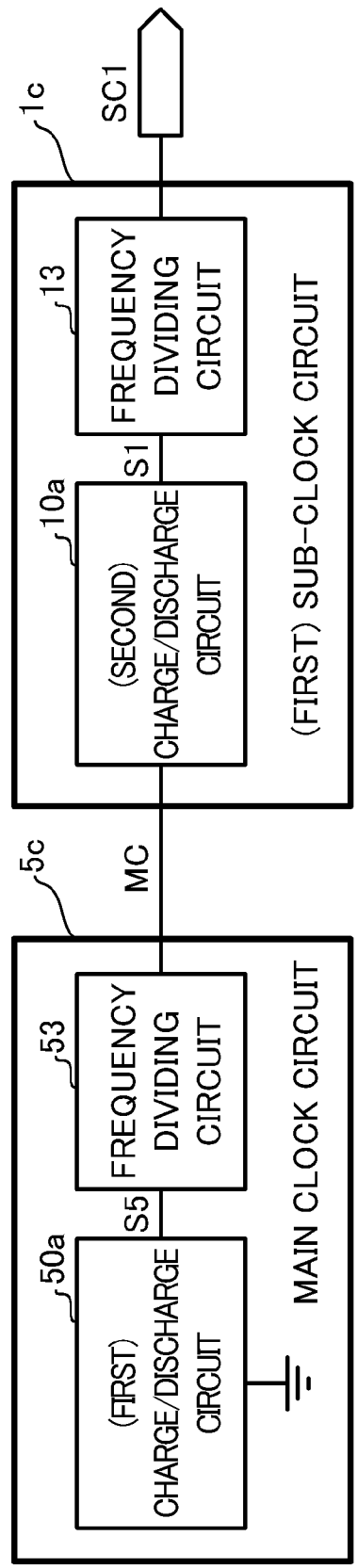
FIG. 8 is a block diagram of another configuration example of a clock generating circuit according to the present invention.

Furthermore, as illustrated in a main clock circuit 5c and a (first) sub-clock circuit 1c of FIG. 8, for example, in a configuration including frequency dividing circuits 53 and 13 corresponding to the first and the second output circuits, respectively, the main clock MC having a frequency different from that of the control signal S5 and the sub-clock SC1 having a frequency different from that of the control signal S1 may be output from the main clock circuit 5c and the sub-clock circuit 1c, respectively.

In third and fourth embodiments as described above, the four sub-clock circuits 1b to 4b are connected to the main clock circuit 5b in parallel and in series, respectively, but this is not limitative. The clock generating circuit may include an unlimited number of sub-clock circuits to be connected to the main clock circuit and may include a plurality of main clock circuits.

The main clock circuit and the sub-clock circuit according to embodiments described above may be configured as an integrated circuit. In such a case, it may be so configured that a capacitor of each charge/discharge circuit is externally connected and a frequency of the main clock and a frequency of the sub-clock synchronized with the main clock can appropriately be set.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A clock generating circuit comprising:
   a main clock circuit configured to output a main clock; and
   a first sub-clock circuit configured to output a first sub-clock synchronized with the main clock, based on the main clock,
   the main clock circuit including
      a first capacitor having a first end connected to a first potential,
      a first current supply circuit configured to supply to a second end of the first capacitor a first current for charging at a predetermined current value or a second current for discharging at a predetermined current value,
      a first charge/discharge control circuit configured to output a first control signal for switching between the first current and the second current when a voltage at the second end of the first capacitor has reached a first reference voltage or a second reference voltage higher than the first reference voltage, the first current and the second current supplied to the first capacitor from the first current supply circuit, and
      a first output circuit configured to output the main clock according to the first control signal, the first sub-clock circuit including
a second capacitor having a first end to which the main clock is input,
a second current supply circuit configured to supply to a second end of the second capacitor a third current for charging at a predetermined current value or a fourth current for discharging at a predetermined current value,
a second charge/discharge control circuit configured to output a second control signal for switching between the third current and the fourth current when a voltage at the second end of the second capacitor has reached a third reference voltage or a fourth reference voltage higher than the third reference voltage, the third current and the fourth current supplied to the second capacitor from the second current supply circuit, and
a second output circuit configured to output the first sub-clock according to the second control signal.

2. The clock generating circuit according to claim 1, wherein
the first charge/discharge control circuit includes:
a first switch circuit configured to supply the first current to the first capacitor;
a second switch circuit configured to supply the second current to the first capacitor; and
a first switch control circuit configured to output the first control signal for turning on or off the first switch circuit and the second switch circuit in a complementary manner, so that the first switch circuit is turned on when the voltage at the second end of the first capacitor has reached the first reference voltage, and the second switch circuit is turned on when the voltage at the second end of the first capacitor has reached the second reference voltage, and
wherein the second charge/discharge control circuit includes:
a third switch circuit configured to supply the third current to the second capacitor;
a fourth switch circuit configured to supply the fourth current to the second capacitor; and
a second switch control circuit configured to output the second control signal for turning on or off the third switch circuit and the fourth switch circuit in a complementary manner, so that the third switch circuit is turned on when the voltage at the second end of the second capacitor has reached the third reference voltage, and the fourth switch circuit is turned on when the voltage at the second end of the second capacitor has reached the fourth reference voltage.

3. The clock generating circuit according to claim 1, wherein
the first output circuit frequency-divides the first control signal to output the main clock, and wherein
the second output circuit frequency-divides the second control signal to output the first sub-clock.

4. The clock generating circuit according to claim 2, wherein
the first output circuit frequency-divides the first control signal to output the main clock, and wherein
the second output circuit frequency-divides the second control signal to output the first sub-clock.

5. The clock generating circuit according to claim 1, wherein
the first output circuit fixes an output thereof to a second potential when the first output circuit does not output the main clock, and wherein the second output circuit fixes an output thereof to a third potential when the second output circuit does not output the first sub-clock.

6. The clock generating circuit according to claim 2, wherein
the first output circuit fixes an output thereof to a second potential when the first output circuit does not output the main clock, and wherein
the second output circuit fixes an output thereof to a third potential when the second output circuit does not output the first sub-clock.

7. The clock generating circuit according to claim 3, wherein
the first output circuit fixes an output thereof to a second potential when the first output circuit does not output the main clock, and wherein
the second output circuit fixes an output thereof to a third potential when the second output circuit does not output the first sub-clock.

8. The clock generating circuit according to claim 4, wherein
the first output circuit fixes an output thereof to a second potential when the first output circuit does not output the main clock, and wherein
the second output circuit fixes an output thereof to a third potential when the second output circuit does not output the first sub-clock.

9. The clock generating circuit according to claim 1, further comprising:
a second sub-clock circuit connected in parallel with the first sub-clock circuit, the second sub-clock circuit configured to output a second sub-clock synchronized with the main clock, based on the main clock, wherein
the second sub-clock circuit includes:
a third capacitor having a first end to which the main clock is input;
a third current supply circuit configured to supply to a second end of the third capacitor a fifth current for charging at a predetermined current value or a sixth current for discharging at a predetermined current value;
a third charge/discharge control circuit configured to output a third control signal for switching between the fifth current and the sixth current when a voltage at the second end of the third capacitor has reached a fifth reference voltage or a sixth reference voltage higher than the fifth reference voltage, the fifth current and the sixth current supplied to the third capacitor from the third current supply circuit; and
a third output circuit configured to output the second sub-clock according to the third control signal.

10. The clock generating circuit according to claim 1, further comprising:
a second sub-clock circuit connected in parallel with the first sub-clock circuit, the second sub-clock circuit configured to output a second sub-clock synchronized with the main clock, based on the main clock, wherein
the second sub-clock circuit includes:
a third capacitor having a first end to which the main clock is input;
a third current supply circuit configured to supply to a second end of the third capacitor a fifth current for charging at a predetermined current value or a sixth current for discharging at a predetermined current value;

a third charge/discharge control circuit configured to output a third control signal for switching between the fifth current and the sixth current when a voltage at the second end of the third capacitor has reached a fifth reference voltage or a sixth reference voltage higher than the fifth reference voltage, the fifth current and the sixth current supplied to the third capacitor from the third current supply circuit; and a third output circuit configured to output the second sub-clock according to the third control signal.

* * * * *